United States Patent [19]

Gaskill, Jr. et al.

[11] 3,955,099
[45] May 4, 1976

[54] DIODE CONTROLLED IDLE CURRENT INJECTION

[75] Inventors: James R. Gaskill, Jr., Pacific Palisades; Don C. Devendorf, Los Angeles, both of Calif.

[73] Assignee: Hughes Aircraft Company, Culver City, Calif.

[22] Filed: Mar. 11, 1974

[21] Appl. No.: 450,019

[52] U.S. Cl............................. 307/218; 307/203; 307/254; 307/300
[51] Int. Cl.² ..................................... H03K 17/00
[58] Field of Search .................. 307/300, 203–218, 307/254, 319, 317 A; 330/30 D

[56] References Cited
UNITED STATES PATENTS

| 2,757,286 | 7/1956 | Wanlass | 307/254 |
|---|---|---|---|
| 3,197,657 | 7/1965 | Clarke | 307/218 |
| 3,541,464 | 11/1970 | Slemmer | 307/319 |
| 3,643,230 | 2/1972 | Lynes | 307/317 A |

OTHER PUBLICATIONS
Hot Carrier Diodes Switch in Picoseconds by Krakauer et al., Electronics, 7/1963, pp. 53–55.

Primary Examiner—Stanley D. Miller, Jr.
Assistant Examiner—B. P. Davis
Attorney, Agent, or Firm—F. I. Konzem; W. H. MacAllister

[57] ABSTRACT

Diodes having a fast response time are used in an Emitter-Coupled Logic (ECL) current switch circuit to cause the injection of an idle current in each of the transistors of said switch. The injection of the idle current through these transistors causes them to operate at all times in an active region. When the transistors remain in the active operating region and are subjected to a switching transient, the parasitic capacitance associated with emitter base and collector base junctions are not charged and discharged to the same extent that they would be if the transistor was turned off completely. Moreover, if the transistors are held on, delay required for minority profile "buildup" in the base region is reduced and the current switch's propagation delay is reduced. When the fast response diodes are used to cause the injection of idle current in a cascode circuit, the overall transient response is greatly improved in both the lower and upper current switch sections; and there is a reduction of spurious output signals. Schottky diodes can be used in said circuit due to their fast response time. Alternatively large value resistors or current source transistors are used when diodes are not used.

6 Claims, 5 Drawing Figures

DIODE CONTROLLED IDLE CURRENT INJECTION

BACKGROUND OF THE INVENTION

1. Field of the Invention

This invention relates to the injection of idle current into a current switch and, more particularly, to the use of fast response diodes to cause the injection of the idle current in the current switch to reduce the propagation delay in said switch.

2. Description of the Prior Art

In the prior art, both Emitter-Coupled Logic (ECL) gate circuits and cascode circuits have been used at current switches. FIG. 1 illustrates the basic current-switch emitter-follower ECL gate circuit. The propagation time delay between the midpoint of a signal $V_{IN}$, input to the basic circuit and the midpoint of (either of) its output voltage signal(s) may be expressed as:

$t_{pd} = t_{pd1} + t_{pd2} + t_{pd3}$ wherein (for a positive input signal transition), $t_{pd1}$ is the time required to charge the emitter-base junction (capacitance) of the input transistor from its initial value to a value at which the transistor can begin to conduct (e.g. from 0.4 to about 0.7 volts), $t_{pd2}$ is the time required for current transfer given that both switching transistors are fully activated, $t_{pd3}$ is the time required to charge (or discharge) the equivalent capacitance at either collector node through the load resistor connected thereto.

To improve the speed of such basic ECL circuits, the possibility of incorporating idle current injection features and "keep alive" (KA) diodes in a manner similar to that suggested in FIG. 2 and discussed below was studied by Rigby with the intent of reduction of the $t_{pd1}$ component of delay and addition instead of another smaller delay component, the diode switching time. Rigby's work, reported in 1963 in an article entitled *High Speed Emitter Current Switching*, published in the (Australian) technical journal, Proceedings of IREE, dealt only with the use of discrete component circuits and in general found that the response time of conventional p-n junction diodes available in 1963 and considered by him was too great to afford any meaningful overall circuit delay reduction. One aspect of the invention at hand, however, concerns the use of Schottky or other fast response KA diodes in the basic current switch, their incorporation in integrated circuits being accomplished in a manner similar to that used in the manufacture of "Schottky Transistor Logic" so as to entail the expense of relatively little extra monolithic circuit silicon area, and utilizing only currently "standard" manufacturing processes. The switching time of such Schottky diodes, being much shorter than $t_{pd1}$ in a circuit not incorporating them, meaningful delay reduction can actually be attained.

Another aspect of the invention pertains to the use of Schottky or any other KA diodes and idle current injection circuitry in cascode switching circuits, in a manner suggested in FIG. 3 and discussed below. In this application, idle current injection permits improvements of cascode circuit performance in a manner not described in the literature or any known prior art. Neither cascode circuits or their improvements were discussed by Rigby. Such cascode circuits have greater logical flexibility and computational capability than basic ECL gates because of their series gating structure. One of the problems though with these switches is their slightly increased delay in switching relative to conventional current switch emitter follower circuits and their generation of spurious output signals or glytches under certain conditions, as described later below. The present invention though nearly eliminates these glytches and speeds up the switching time of, both lower and upper switching sections, said circuits by injecting idle current through the lower current switch transistors of said circuits and to the cascode nodes, i.e. those at the emitters of the upper switching transistors. The injection of said idle current is controlled by the use of Schottky diodes.

In still another aspect of the present invention, no KA diodes are used and idle currents are injected only at the upper current switch cascode nodes. This injection and the means for its accomplishment as well as the particular improvements obtained thereby, not described in any known literature or prior art, are also disclosed in the following.

SUMMARY OF THE INVENTION

In an ECL current switch emitter follower gate having a current switch comprising a pair of transistors and emitter-follower outputs, fast response diodes, such as Schottky "keep alive" diodes are used to cause injection of idle current into said transistors. Since the transistors are biased in the active region, the delay required to charge (or discharge) their emitter-base junctions and for subsequent minority carrier profile "buildup" in the base of the transistors is reduced thereby reducing the current switch's propagation delay time.

Idle current injection into the transistors of an ECL cascode circuit using fast response diodes will reduce the circuit's propagation delay time and the amplitude of glytch output signals.

Accordingly, it is an object of this invention to provide idle current injection into a current switch by the use of fast response diodes.

Another object of the present invention is to reduce the delay in the switching of a current switch.

A further object of the present invention is to provide delay reduction and stabilization in a cascode circuit through the use of idle current injection and to reduce spurious output signals in said switch by the use of said idle current injection.

Still another object of the present invention is the alternative use of large valued resistors or current source transistors to inject idle current at the cascode nodes common to the emitters of the upper current switch transistors in place of KA diodes and current injection at the emitters of the lower current switch transistors. Since one of the upper current switch transistors is held "on" by the injection of this idle current, the delay required to charge and discharge upper current switch emitter base junction capacitances and for minority profile "buildup" during switching of these transistors is reduced, thereby reducing the overall cascode current switch's propagation delay time and also reducing spurious output signals sometimes produced by the cascode circuit.

Other objects and advantages of this invention will become apparent from the following portion of the specification, the claims, and the attached drawings.

DETAILED DESCRIPTION

Figure 2:
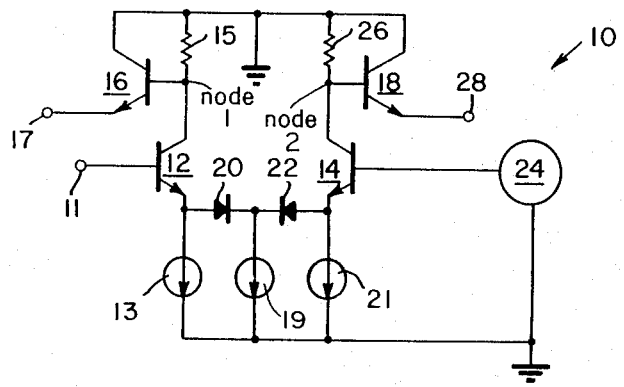
FIG. 2 is a schematic of the first embodiment of the present invention, an ECL current switch which incorporates Schottky or other fast response diodes, to inject idle current into the transistors of said current switch.

Referring to FIG. 2 of the drawings, which is a first embodiment of the present invention, the ECL gate switching network 10 consists of a current switch containing transistors 12 and 14, emitter-follower output transistors 16 and 18, two sources of idle current 13 and 21, and two Schottky or other fast response diodes 20 and 22. Logical signals are applied at the signal input 11; a logical "1" or high is, for example, approximately −0.9 volts and a logical "0" or low is, for example, approximately −1.7 volts. Said signal input is connected to the base of transistor 12. The collector of transistor 12 is connected to the base of the first emitter-follower transistor 16 and to load resistor 15, which is returned to ground or any appropriate $V_{CC}$ supply. The emitter of transistor 14 is connected to the base of emitter-follower transistor 18 and to load resistor 26, the other end of which is returned to ground or to any other appropriate $V_{CC}$ supply. The emitter of transistor 12 is connected to the anode side of Schottky "Keep alive" diode 20 and to the negative side of idle current source 13. The cathode side of diode 20 is connected to the cathode side of Schottky "keep alive" diode 22 and to the negative side of switch current source 19. The anode side of diode 22 is connected to the emitter of transistor 14 and to the negative side of idle current source 21. The base of transistor 14 is connected to a fixed bias input 24 which may be fixed at approximately −1.30 volts, for example, concomitant with the input signal levels suggested above. The emitter of transistor 18 is connected to the non-inverting output 28 of the ECL gate circuit 10.

CIRCUIT OPERATION

Figure 1:
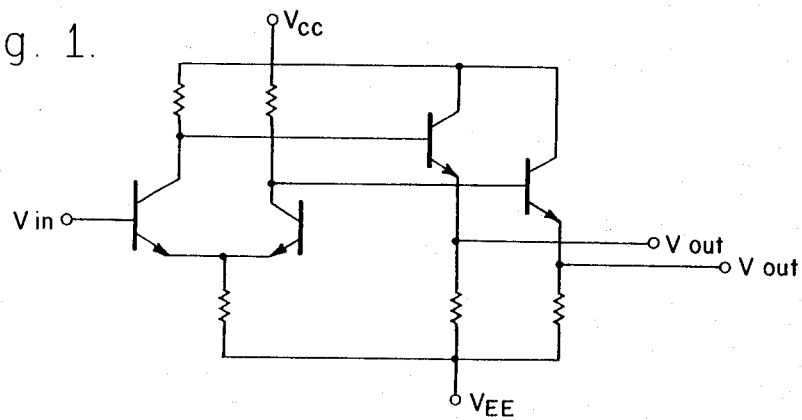
FIG. 1 is a schematic or a prior art ECL gate circuit.

Neglecting Schottky diodes 20 and 22 and the idle current sources for the moment, and considering a basic ECL gate such as in FIG. 1, in order to explain the operation of the current switch, when the input signal is a logical "1" or high level signal (e.g. −0.9 volts), it is noted that the voltage at the emitter of the input transistor will be at −1.7 volts; and if the reference voltage is at about −1.3 volts, the base-to-emitter voltage ($V_{BE}$) drop across the other switching transistor will only be −0.4 volts since the emitter of the input transistor is holding the emitter of the non-driven transistor at −1.7 volts. Therefore, when a high input signal is present, the driven transistor is turned on and $V_{BE}$ of the other transistor is only −0.4 volts at which it conducts virtually no current. Also, when the input signal is high, the base of the first emitter follower transistor is pulled low, causing its associated emitter output to go low; and the base of the other emitter follower transistor remains high, e.g. at ground, causing its output to remain high.

When the input signal is a logical "0" or low (e.g. −1.7 volts), the other switching transistor turns on because $V_{BE}$ of that transistor is −0.8 volts with the voltage at its emitter at −2.1 volts. This emitter voltage in turn holds the voltage at the emitter of the driven transistor to be at −2.1 volts, so that its $V_{BE}$ is −0.4 volts (−2.1 − [−1.7]; therefore, the driven transistor is effectively turned off. Also, when the input signal is low, the base of the second emitter follower transistor is pulled low, causing its associated output to go low; and the base of the first emitter follower transistor remains high, causing its associated output to remain high.

Now in the following, the Schottky diodes 20 and 22 and idle current sources 13 and 21 are assumed to be incorporated in the current switch 10 as shown in FIG. 2. When these elements are incorporated, then with the input at 11 in a high state (e.g. at −0.9 volts), the voltage at the emitter of transistor 12 will be about at −1.7 volts and the voltage at the cathode of Schottky diode 20 will be at approximately −2.2 volts because of the approximately −0.5 volts drop typically developed across Schottky diodes when they are conducting currents in the range of interest; e.g. 4 mA or 8 mA plus the idle current. (Note that their conducting $V_{BE}$ drop differs from conventional diodes or transistor junctions.) The reference voltage at 24 is in this example taken to be at −1.3 volts, and $V_{BE}$ of transistor 14 may be about −0.75 volts since it is still turned on but now conducting only the idle current drawn from source 21. Therefore, the voltage at the emitter of transistor 14 is −2.05 volts. Since the voltage at the cathode of diode 22 is held at −2.12 volts by the voltage at the cathode of diode 20, the voltage drop across diode 22 is only −0.15 volts at which diode 22 may be treated as completely cutoff and, therefore, blocking the flow of switch current from source 19.

When the input at 11 is low (e.g. −1.7 volts), the voltage at the emitter of transistor 14 is −2.1 volts, and the voltage at the cathode of diode 22 is −2.6 volts. $V_{BE}$ of transistor 12 is only about −0.75 volts, for said transistor is only conducting idle current from source 13 but still "turned on". The voltage at the emitter of transistor 12 is −2.45 volts; thus, the voltage drop across diode 20 is only −0.15 volts; therefore, diode 20 now blocks the flow of switch current to the current source 19.

The relative advantage of idle current injection may now be determined by a consideration first of the transient operation of the basic current switch emitter-follower circuit without this injection feature. In the basic circuit, when the input signal at 11 is switched from high to low, transistor 12 is turned off and transistor 14 is turned on; the time that it takes to turn on transistor 14 and hence the circuit propagation delay time is affected by the time during which the transistor 14 emitter base junction capacitance is charged. By way of contrast, when idle current injection is incorporated, however, as suggested in FIG. 2, then a small idle current is conducted through transistor 14; and when following a negative input signal transition, the switch current is later transferred from transistor 12 to transistor 14, the $V_{BE}$ of transistor 14 has only to increase slightly to conduct the switch current plus idle current. The delay through the circuit 10 is, therefore, smaller than it would be for the same circuit without idle current injection. The delay is smaller because transistor 14 stays turned on, and the only delay is the time needed to supply extra base and emitter charge to transistor 14 as its emitter current increases from idle current to idle current plus switch current plus the small diode switching time. In the same circuit without idle current injection, the delay through transistor 14 includes the time to supply the extra charge plus the time to turn transistor 14 on originally (by first charging its base emitter junction capacitance).

The injection of idle current into transistors 12 and 14 is accomplished by two idle current sources 13 and 21, which may be either resistors or electronic current sources of the same type as described later in FIGS. 4 and 5. Also, a main or switch current source 19 is provided in circuit 10 which may also be a resistor or an electronic current source. The ratio of idle current to switch current may typically be from 1:10 to 1:2.

The Schottky "keep alive" diodes 20 and 22 either conduct or block the flow of switch current from the switch current source 19 as determined by the state of the signal input at 11.

The Schottky barrier diodes, which are metal semiconductor junctions, are used because they exhibit very small foward (and reverse) storage time(s) (e.g. on the order of 100pS) and, therefore, they switch from conduction to cutoff in a time which is generally substantially shorter than the time required to charge and/or discharge the emitter base junctions of the switching transistors (assumed to be fabricated using current production IC processes). Although Schottky diodes are used in this example, any diode with comparably fast response time could also be used.

Figure 3:
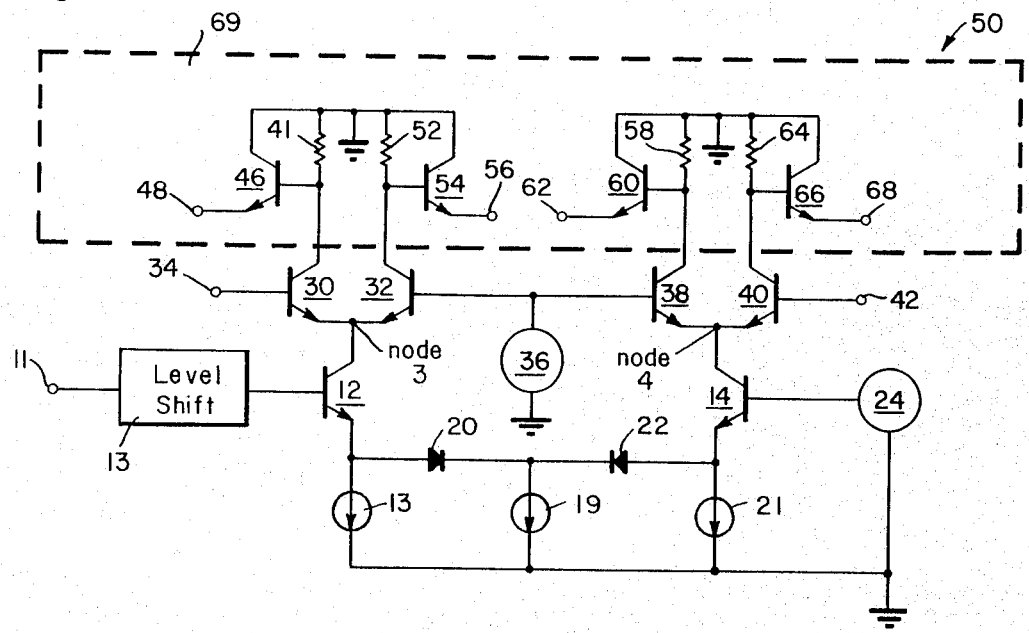
FIG. 3 is a schematic or the second embodiment of the present invention, a cascode circuit using Schottky or other fast response diodes to inject idle current into the transistors of said cascode circuit.

FIG. 3 shows the second embodiment of the present invention which consists of an ECL cascode circuit 50 having a lower current switch consisting of transistors 12 and 14 and a pair of upper current switches consisting of transistors 30, 32, 38, and 40. The ECL cascode circuit 50 also contains signal inputs 11, 34, and 42; two bias inputs 24 and 36; two idle current sources; and a switch current source. In many ECL circuits, the single transistors (30 and 40) connected to the inputs (34 and 42) in FIG. 3 are replaced by multiple transistors to provide, for example, a plurality of inputs to the circuit. This variation doesn't effect the invention or the principles of the invention at hand, however; and, therefore, to simplify descriptions below, single transistors are assumed. Signal input 11 which receives either a logical "1" which may be approximately −0.9 volts or a logical "0" which may be approximately −1.7 volts is connected to level shift circuit 13 which may consist of an NPN transistor and a diode, the emitter of said tranisstor being connected to the anode of said diode. The output of level shift circuit 13 is connected to the base of the first transistor 12 of the lower current switch.

Alternatively any other of a number of well-known level shift circuits providing, for example, a −1.6 volts drop between the input 11 and the base of transistor 12 may be used. It is also noted that (possibly to provide multiple lower current switch circuit logical inputs) multiple emitter-follower transistors may be incorporated in the level shift circuitry or that multiple transistors (each with its own level shift input circuit) may be used instead of the single transistor 12. To simplify descriptions presented below, however, it is assumed that only a single lower current switch input and single transistor 12 are incorporated in the circuit. The principles and implementation of the invention remain the same regardless of whether or not such multiple input features are incorporated.

The collector of transistor 12 is connected to both the emitters of transistors 30 and 32, which form the first upper current switch. The base of transistor 30 is connected to input 34, and the emitter of transistor 30 is connected to the emitter of transistor 32. The base of transistor 32 is connected to reference voltage source 36 and to the base of transistor 38.

Transistors 38 and 40 form the second upper current switch. The emitter of transistor 38 is connected to the emitter of transistor 40 and to the collector of transistor 14 which is the second transistor of the lower current switch. The base of transistor 40 is connected to signal input 42.

The base of transistor 14 is connected to a second reference voltage source 24. The emitter of transistor 14 is connected to the anode of Schottky "keep alive" diode 22 and to idle current source 21. The cascode of diode 22 is connected to the cathode of Schottky "keep alive" diode 20 and to switch current source 19. The anode of diode 20 is connected to the emitter of transistor 12 and to idle current source 13.

In cascode current switch circuits a large variety of output circuit networks are used. These may entail "collector dotting" wherein, for example, the collectors from two or more of the upper current switch transistors such as 30 and 38 are connected together and fed to a single load resistor and emitter-follower. Said output circuits may also or alternatively entail cross connection of emitter-follower outputs thereby forming an "implicit-or" function. To simplify the following description, however, it is assumed for purposes only of clarification that separate output subcircuits 69 are used. It is to be understood though that this simplification in no way limits the invention which involves improvements principally effecting those sections of the circuitry described above.

In the output circuitry the collector of transistor 30 may be connected to resistor 41 and to the base of transistor 46. Resistor 41, connected to the base of transistor 46, is returned to ground or any appropriate $V_{CC}$ supply voltage. The emitter of transistor 46 is connected to output 48. Resistor 52 is connected to the base of transistor 54 and returned to ground or any appropriate $V_{CC}$ supply voltage and the emitter of transistor 54 is connected to output 56. The collector of transistor 38 is connected to resistor 58 and to the base of transistor 60. Resistor 58, connected to the base of transistor 60, is returned to ground or any appropriate $V_{CC}$ supply voltage. And, the emitter of transistor 60 is connected to output 62. The collector of transistor 40 is connected to resistor 64 and to the base of transistor 66. Resistor 64, connected to the base of transistor 66, is returned to ground or any other appropriate $V_{CC}$ supply voltage. And, the emitter of transistor 66 is connected to output 68.

CIRCUIT OPERATION

In the ECL cascode circuit 50 shown in FIG. 3, the steering of the switch current through the tree of transistors is determined by the input signal at 11. When the input signal at 11 is a logical "1" or high level signal (e.g. −0.9 volts), the voltage at the emitter of transistor 12 will, for example, be at −3.3 volts since the $V_{BE}$ (base to emitter voltage) drop across said transistor is about −0.8 volts; and the level shift circuit translates the original input by about −1.6v to the base of transistor 12. If the bias input or reference voltage level from source 24 is, for example, at −2.9 volts, then the transistor 14 emitter voltage will be at about −3.65 volts since the $V_{BE}$ of this transistor will then be at about −0.75 volts. Its $V_{BE}$ drop is 50 millivolts less than that of transistor 12 because transistor 14 is taken to be conducting only the idle current from source 21 while transistor 12 is assumed to be conducting both the switch current from source 19 and the idle current from source 13. These above conduction conditions can be verified by the following determination of the voltage impressed across the diodes 20 and 22. With the emitter of transistor 12 at −3.3 volts and diode 20 conducting with its associated forward drop of about 0.5 volts, the voltage at the node common to the cathodes of both diodes will be at about −3.8 volts. Thus, with the emitter of transistor 14 at about −3.65 volts, only about 0.15 volts will be impressed (in a forward direction) across diode 22. At this voltage drive, diode 22 may then be taken to be completely cut off and blocking the flow of current from source 19, verifying the assumed conditions. Also, when input 34 is high, the switch current passes from the first "cascode node", at the emitters of transistors 30 and 32 through transistor 12. If the input at 34 is high, the current passes through transistor 30. Alternatively, if the signal input at 34 is low, the current passes instead through transistor 32.

When the input signal at 11 is a logical "0" or low (e.g. −1.7 volts), the base voltage of transistor 12 is low (e.g. at −3.3 volts) and transistor 14 conducts both the switch current from source 19 and the idle current from source 21 while transistor 12 conducts only the idle current from source 13. Thus, with a low input (−1.7 volts) at 11, the voltage at the emitter of transistor 12 will be at about −4.05 volts (about 0.75 volts below its base voltage). Concurrently, the emitter voltage of transistor 14 will be at about −3.7 volts (about 0.8 volts below its −2.9 volts base reference input level). Under these conditions diode 22 will be conducting the switch current; and, therefore, with its approximately 0.5 volt forward drop, the voltage at the node common to the cathodes of both diodes will be at about −4.2 volts. Consequently, the forward drop across diode 20 will be only about 0.15 volts (−4.05 - [− 4.2]) at which diode 20 may be treated as cutoff, blocking the flow of any of the switch current from source 19. Also, when the input at 11 is a low signal level, current flows through transistor 14, to the second "cascode node" at the emitters of transistors 38 and 40, and then through transistor 40 if its input 42 is high; otherwise, it flows through transistor 38.

The effects of "keep alive" diode controlled injection of idle current from source 13 through lower current switch transistor 12 and to the first cascode node and of the injection of idle current from source 21 through lower current switch transistor 14 and to the second cascode node are primarily the following: (1) reducing overall circuit propagation delay, and (2) reducing spurious or glitch output signals produced by the circuit under certain conditions, as described in detail below.

Propagation delay reduction is achieved in both the lower and upper current switch sections but through separate mechanisms. In the lower current switch, the delay reduction mechanism is precisely the same as that described above in relation to the current switch emitter-follower of FIG. 2. With idle current injection, the time required to charge the emitter-base junction of the particular transistor being turned on in a given transition, before it can begin to conduct switch current, is virtually eliminated; and a generally much shorter "keep alive" (Schottky) diode switching delay is introduced instead. In the cascode circuit, however, one important difference exists relative to the basic current switch emitter-follower. In the cascode circuit, the incoming signal at 11 is slightly delayed (particularly for negative going transitions) in its "transmission" through the level shift circuit. Consequently, delay reduction in the lower current switching section proper (transistors 12 and 14 with diodes 20 and 22) partially compensates for the added delay through the level shift circuit. This compensating improvement tends to make the overall cascode circuit's delay more nearly equal to that exhibited by the basic ECL current switch emitter-follower circuit. Additional delay reduction at the upper current switches is brought about through a separate mechanism due to the fact that the idle currents passed through transistors 12 and 14 are drawn initially from the cascode nodes respectively at the emitter junctions of the transistors 30 and 32 and of transistors 38 and 40.

The effects of the idle current at these cascode nodes in improving circuit propagation delay are next described in terms of current initially switched through transistor 14 and after the lower switch responds, to flow through transistor 40, its input being high (e.g. −0.9 volts) and constant before and after the transition of the input signal 11. During the lower current switch transfer, the transistor 40 "turn on time", and hence, the circuit's propagation delay is effected by the time during which the transistor 14 collector current charges the transistor 40 emitter base junction capacitance and the other capacitance present at the second cascode node. This charging time depends on the initial value of the voltage at the cascode node. When the input at 11 is high, the switch current is fed through transistor 12; but with idle current injected through transistor 40 (and then through transistor 14), transistor 40 remains turned on. Consequently, after input 11 "falls and when switch current is later transferred back through transistor 14, the $V_{BE}$ of transistor 40 increases only slightly to conduct switch current plus idle current. The delay through transistor 40 and thus the whole circuit is, therefore, smaller than it would be for the same circuit without idle current injection at the cascode node. The delay is smaller because transistor 40 stays turned on; and the only delay is the time needed to supply extra base and emitter charge to this transistor as its emitter current increases from idle current to idle current plus switch current. In the same circuit without idle current injection, the delay through transistor 40 includes the time to supply this extra charge plus the time to turn it on originally.

Moreover, the time required to supply the extra base and emitter charge depends on the cascode node voltage excursion. Without idle current injection, this excursion may be as large as about 0.4 volts. since the range on this excursion is kept small by the presence of idle current, variation of this charging time and, therefore, of overall circuit propagation delay is is made nearly constant and independent of the circuit's sequential duty cycle and operational frequency.

Similar improvements are obtained through idle current injection at node 3.

A problem in cascode circuits such as 50 in FIG. 3 is their production of spurious output signals or "glytches" following simultaneous transitions of the lower current switch input signal and one or both of the upper current switch input signals. Such glytches occur when a portion of the switch current is temporarily drawn through an upper current switch transistor causing a concomitant temporary drop in its associated output voltage or when switch current being drawn through an upper current switch transistor is temporarily reduced causing a concomitant temporary rise in its associated output voltage.

Two mechanisms are responsible for these spurious glytch outputs. One mechanism has to do with the fact that without idle current injection, the "transfer delay" of the cascode circuit's lower current switch is somewhat greater than the "transfer delay" of either of its upper current switches. The other has to do with a charge imbalance in the emitter base junctions of the transistors of one upper current switch which develops while the switch current is being drawn through the outer current switch.

These complex and interrelated mechanisms and the way that idle current injection acts to reduce their deleterious effects can be described approximately in the following example contrasting circuit behavior with and without idle current injection. In the example it is assumed that initially inputs 11, 34, and 42 are low and have been at their low values for a relatively long time. It is then assumed that all three inputs simultaneously undergo a negative to positive transition (e.g. −1.7 volts to −0.9 volts).

Before considering the behavior of the circuit during and right after these transitions, it is first noted that with the inputs all low, and the circuit in a steady state condition, switch current is conducted through transistors 14 and 38 causing a drop across resistor 58 and, therefore, a low output 62. All other inputs are high for these input conditions. Similarly, it is noted that at some time after all three input signals have undergone their transitions to the high state and the circuit has "come to rest", switch current will be conducted through transistors 12 and 30 causing a drop across resistor 41 and a low output at 48. All other outputs are to be in a high state for the (3 inputs high) input condition. Consequently, it is noted that both before and after the transition, outputs 56 and 68 are to be in a high state. Moreover, they should remain in that high state during the transition as well. If these outputs should drop temporarily, however, during the transition, generating spurious outputs, these spurious or glytch outputs may be fed to other logic circuits being driven by the one considered, thereby possibly causing erroneous results to be computed by the digital network in which the cascode circuit is incorporated.

Now consideration is directed toward the behavior of the circuit with idle current injection during and after the transition. Just before the transition, the voltage at the emitters of transistors 30 and 32 will be at about −2.05 volts because the idle current is being conducted through transistor 32; and its base is connected to the −1.3 volts reference source 36. Thus, before the transition, the (base-emitter voltage) $V_{BE}$ of transistor 32 is 0.75 volts and the $V_{BE}$ of transistor 30 is about 0.35 volts. With the low input applied at 11 and the level shift circuit taken to introduce about a 1.6 volts drop, the base of transistor 12 is about −3.3 volts so that the (collector-base voltage) $V_{CB}$ of transistor 12 is about +1.25 volts. Similarly after the transition, examination of the circuit reveals that the voltage at the emitters of transistors 30 and 32 will be at about −1.7 volts while that at the base of transistor 12 will be at about −2.5 volts. Thus, after the transition $V_{BE}$ of transistor 30 will be at about 0.8 volts, $V_{BE}$ of transistor 32 will be at about 0.4 volts, and $V_{CB}$ of transistor 12 will be at about 0.8 volts. Therefore, during the circuit's state transfer, a change in the transistor 30 $V_{BE}$ will be about 0.45 volts (positive) and a change in the transistor 12 $V_{CB}$ will be about 0.8 volts (negative or discharge). (It will be important to recall these incremental changes in junction voltages when the circuit's behavior without idle current is considered shortly below.)

Immediately following the input signal transitions, the lower current switch's base drive input at transistor 12 is delayed (e.g. by about 100pS) due to lag through the level shift circuit. However, because transistor 12 is kept active with idle current injection, the transfer at the upper left differential pair (30, 32) occurs only very slightly in advance of the time when switch current is drawn through transistor 12. Therefore, when this current begins to increase, it flows correctly as it should through transistor 30 and no spurious current flows through transistor 32. Thus, output 56 remains high as it is supposed to during and after the transition. Because of the slight delay in the response of the lower current switch, however, partial switching of the right-hand upper current switch does occur before switch current is no longer drawn from the emitters of this pair (transistors 38 and 40). Thus, a small and short duration glytch current does flow through transistor 40; and there is a small negative glytch pulse at output 68. The situation is much worse, however, when idle current injection isn't used. This situation is as follows.

In the same circuit but without idle current injection, just before the input signals undergo their low to high transition, the internal circuit conditions differ significantly from the previously considered case. Because the inputs are assumed to have been in their constant low state for some time, the voltage at the emitters of transistors 30 and 32 has "floated" up to a value about midway between the voltage at the bases of these transistors, i.e. the emitter voltage is about −1.5 volts. Small leakage currents in the circuit have caused this to occur. Note that since its input is low, transistor 12 isn't conducting and so the node common to the transistor 30 and 32 emitters is essentially "uncontrolled". Consequently, the $V_{BE}$ of transistor 30 is at about −0.2 volts and the $V_{BE}$ of transistor 32 is at about +0.2 volts. The $V_{CB}$ of transistor 12 is at about +1.8 volts. The values of $V_{BE}$ for transistors 30 and 32 and the value of $V_{CB}$ of transistor 12 after the transition will be the same as they were in the circuit with idle current injection. Thus, in this case during the transition, $V_{BE}$ of transistor 30 must change by a full 1 volt; and $V_{CB}$ of transistor 12 must change by 1.8 volts. These changes contrast with changes of 0.45 volts and 0.8 volts for the circuit with idle current.

Following the simultaneous input signal transistors, for the circuit without idle current, the delay through the level shift circuit remains about the same as it was in the previously considered case but the response of the lower current switch (transistors 12 and 14) is delayed relative to that in the previous case. The relative delay occurs because the collector-base junction capacitance of transistor 12 must be charged in parallel with its emitter base capacitance prior to the turn-on of transistor 12 so that it can begin to conduct the switch current. Since the incremental collector junction charge required is more than twice as much and since transistor 12 isn't kept "on" by idle current, however, the lower current switch's response is delayed by a time that is relatively long compared to the switching time of the upper right current switch (transistors 38 and 40). Thus, a significant fraction of the switch current erroneously is caused to flow through transistor 40, thereby causing a negative glytch pulse output 68 which is much larger than that in the same circuit with idle current injection.

The conditions at the emitters of transistors 30 and 32 also causes another glytch output. There, the relatively larger transistor 12 collector junction discharge current into this emitter junction and the fact that $V_{BE}$ of transistor 30 must change by a full volt prior to its condition of any of the switch current drawn from the transistor 12 collector, once lower current switch transfer begins, causes this switch current to be drawn initially through transistor 32. Consequently, output 56 exhibits a negative glytch output pulse also.

Although as has been noted in the above example, idle current injection doesn't completely eliminate glytch outputs, examination of the circuit's response to the various other simultaneous input transitions reveals that idle current injection does meaningfully permit their suppression. In summary, the injection of idle current suppresses glytch signals otherwise produced in the cascode circuit 50. This glytch reduction in addition to the primary benefit of propagation delay stabilization and minimization can be obtained by injecting idle current into the transistors of cascode circuit and by using diodes with a fast response time.

Figure 4:
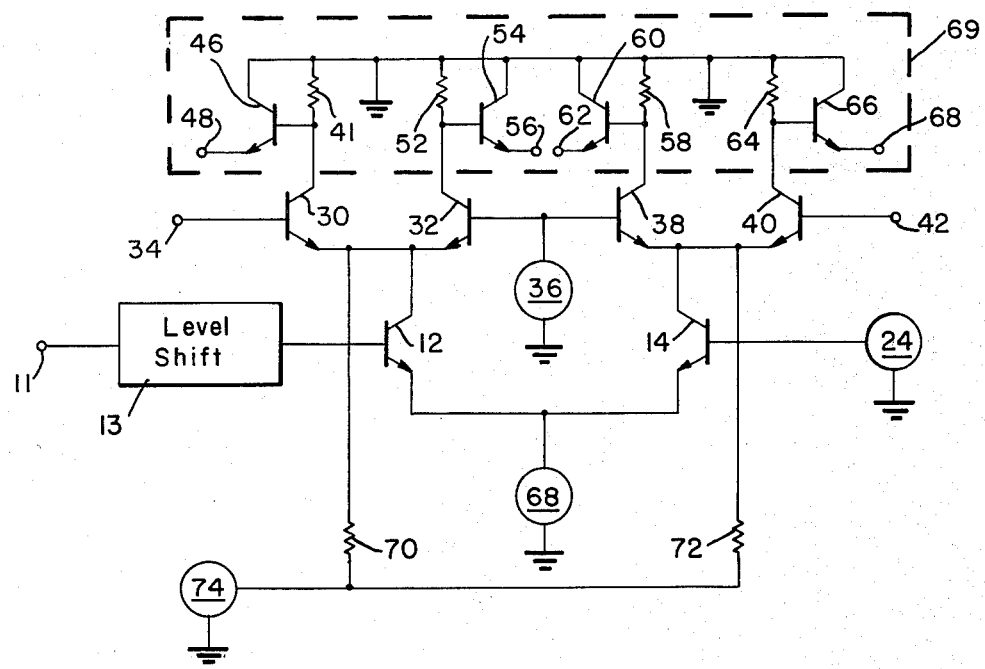
FIG. 4 is a schematic of an ECL cascode current switch circuit which incorporates resistors connected to a source of negative voltage to inject idle current into the upper current switch transistors of said current switch.

FIG. 4 shows the same ECL cascode circuit of FIG. 3 but with resistors 70 and 72 connected between node 3 and node 4 respectively and a source of negative voltage 74 and without diodes 20 and 22 and without sources 13 and 21. Said source of negative voltage is used to provide a source of idle current, as shown in FIG. 3 by idle current sources 13 and 21.

Figure 5:
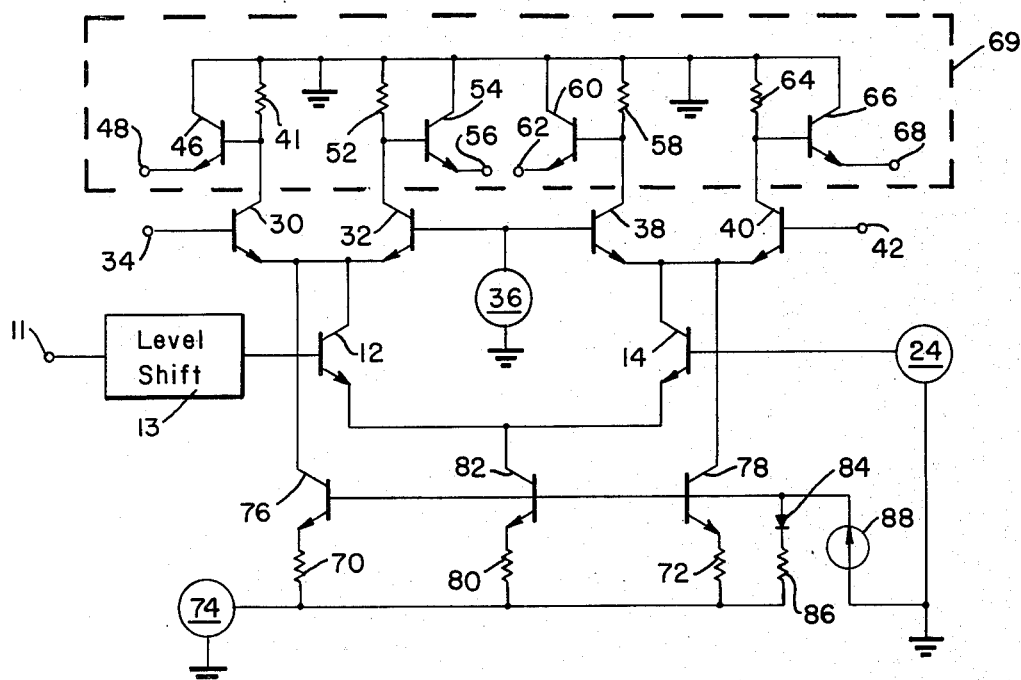
FIG. 5 is a schematic of an ECL cascode current switch which employs current source transistors and resistors connected to a source of negative voltage to inject idle current into the upper current switch transistors of said current switch.

FIG. 5 also shows the ECL cascode circuit of FIG. 3; but in this circuit, the idle current source 13 of FIG. 3 is implemented by transistor 76 and resistor 70, the collector of transistor 76 which draws the idle current being connected to node 3, as shown in FIG. 5, not the same place as shown in FIG. 3, the emitter of said transistor being connected through resistor 70 to negative voltage source 74. Idle current source 21 is implemented by transistor 78 and resistor 72, the collector of transistor 78 which draws the idle current being connected to node 4, instead of where it was connected in FIG. 3, the emitter of said transistor being connected through resistor 72 to negative voltage source 74. Finally, the switch current source 19 of FIG. 3 is implemented by transistor 82 and resistor 80, the collector of transistor 82 connected to the emitters of transistors 12 and 14, the emitter of transistor 82 is connected through resistor 80 to negative voltage source 74. Keep alive diodes are not used.

In FIG. 5 the first idle current drawn from node 3 is produced by current source transistor 76 and resistor 70; the second idle current is produced by transistor 78 and resistor 72. The ratio of the switch current to the idle currents (taken here to be identical in value) is determined approximately by the ratio of (identical) resistors 70 and 72 to resistor 80. The switch current is set by the ratio of resistor 80 to resistor 86 and the value of the pilot source current 88. In this regard, diode 84 is matched in integrated circuits to the emitter base diodes of transistors 76, 78, and 82. Thus, to a first approximation, the $V_{BE}$ drops across transistors 76, 78, 82, and diode 84 may be treated as equal and nearly constant, independent of the currents conducted by them, if said currents are of roughly of the same order of magnitude. Consequently, since the voltages at the base of transistors 76, 78, and 82 and at the anode of diode 84 are identical in all cases, if the $V_{BE}$ drops are taken as everywhere constant, then the voltages at the emitters of transistors 76, 78 and 82 and at the cathode of diode 84 will be about the same. Then since resistors 80, 70, 72, and 86 are all connected at their lower ends to $V_{EE}$, the voltage drops across, all of said resistors will also be nearly the same in all cases. Consequently, the currents in each of the sources are set by adjusting the ratios of resistors 70, 80, and 72 to resistor 86 through which in the latter case the pilot current is constrained to pass. (The base currents in transistors 76, 82, and 78 may be neglected to a first order approximation.)

In the embodiments suggested in FIGS. 5 and 6, the idle currents are not injected through the lower current switch transistors but are instead injected directly at the cascode nodes. Consequently, the effects of cascode node voltage stabilization in reducing delay and making delay nearly constant, as well as the effects of cascode node voltage stabilization on glytch output reduction, are preserved. The lower current switch delay reduction afforded by keeping both lower current switch transistors active isn't achieved though. However, it is noted that in these second embodiments, it is not necessary to incorporate in the integrated circuit, Schottky or other diodes which generally require the use of additional steps in the process of integrated circuit fabrication. Moreover, the idle currents injected can be generally much smaller. Thus, in summary comparison of the different schemes, it is noted that both stabilize cascode node voltages but the added benefits of keep alive diode controlled injection entail added circuit fabrication and design costs. In some applications these costs are warranted while they are not in others.

Although the device which has just been described appears to afford the greater advantages for implementing the invention, it will be understood that various modifications thereto without going beyond the scope of the invention, it being possible to replace certain elements by other elements capable of fulfilling the same technical function therein.

What is claimed is:

1. In an ECL network having a lower current switching circuit and a first and second upper current switching circuit, each circuit comprising a pair of input transistors, whose emitters are connected together, each upper circuit having the bases of one of its input transistors connected to input signals, the bases of other two transistors of said upper circuits being connected to each other and to a bias voltage source, the emitters of said first upper circuit being connected to the collector of said first transistor of said lower circuit and the emitters of said second upper circuit being connected to the collector of said second transistor of said lower circuit, the base of said first transistor being connected to a level shifted input signal and the base of said second transistor of said lower circuit being connected to a bias voltage source, wherein the improvement comprises:

a switch current source;

a plurality of idle current sources;

a plurality of fast response diodes, the anode of the first of said diodes being connected to the emitter of said first transistor of said lower circuit and to the first of said idle current sources and the cathode of said first diode being connected to the cathode of said second diode and to said switch current source, the anode of second diode being connected to the emitter of said second transistor of said lower circuit and to said second idle current source;

said diodes either conduct current from said switch current source through said transistors or block said switch current flow and allow idle current from said idle current sources to flow through said transistors, keeping said transistors turned on, thereby reducing said circuit's propagation delay time and eliminating glytch output signals from said circuit; and said diodes also eliminate delay due to parasitic capacitance at the emitters of said transistors, thereby reducing the switching time of said transistors and the circuit's propagation time.

2. In an ECL circuit as recited in claim 1, said diodes comprise Schottky diodes.

3. In an Emitter-Coupled Logic (ECL) cascode current switching circuit having a lower current switching circuit and a first and second upper current switching circuit, each circuit comprising a pair of input transistors, whose emitters are connected together, each upper circuit having the bases of one of its input transistors connected to input signals, the bases of the other two transistors of said upper circuits being connected to each other and to a bias voltage source, the emitters of said first upper circuit being connected to the collector of said first transistor of said lower circuit and the emitters of said second upper circuit being connected to the collector of said second transistor of said lower circuit, the base of said first transistor being connected to a level shifted input signal and the base of said second transistor of said lower circuit being connected to a bias voltage source, wherein the improvement comprises:

means for injecting idle current into at least one of said upper current switch transistors, to reduce said circuit's propagation delay time and spurious output signals.

4. In an ECL network having a lower current switching circuit and a first and second upper current switching circuit, each circuit comprising a plurality of input transistors and a reference transistor, their emitters being connected, each upper circuit having the bases of one of its input transistors connected to input signals, the bases of the other two reference transistors of said upper circuits being connected to each other and to a bias voltage source, the emitters of said first upper circuit being connected to the collector of said first transistor of said lower circuit and the emitters of said second upper circuit being connected to the collector of said second transistor of said lower circuit, the base of said first transistor being connected to a plurality of level shifted input signals and the base of said second transistor of said lower circuit being connected to a bias voltage source the emitters of the lower current switching transistors being connected together and to the collector of a current source transistor, that current source transistor having its emitter connected through a resistor to a negative voltage source and its base to a diode reference circuit, wherein the improvement comprises:

a first and second idle current source, each comprising a resistor;

said first idle current source is connected between said emitters of said first upper circuit and any appropriate negative voltage source or constant voltage point within said circuit, for supplying idle current to said emitters in order to keep said transistors of said first upper circuit partially conducting at all times to reduce said network's switching time;

said second idle current source is connected between said emitters of said second upper circuit and said negative voltage source for supplying idle current to said emitters in order to keep said transistors of said second circuit partially conducting at all times to reduce said network's switching time;

a switch current source comprising a transistor and a resistor, which is connected between said emitters of said lower circuit and said negative voltage source.

5. In an ECL circuit as recited in claim 3, wherein said means comprises a resistor connected between the emitters of said upper circuits and said negative voltage source.

6. In an ECL circuit as recited in claim 4 wherein each idle current source comprises a transistor with a resistor connected between its emitter and said negative supply voltage and the collector of each current source transistor connected respectively to the emitters of one of said upper circuits, the bases of said current source transistors being connected in common to the base of the main current source transistor.

* * * * *